(12) United States Patent
Pal et al.

(10) Patent No.: US 10,287,701 B2
(45) Date of Patent: May 14, 2019

(54) NANOPARTICLE DEPOSITION IN POROUS AND ON PLANAR SUBSTRATES

(71) Applicant: The Trustees of Boston University, Boston, MA (US)

(72) Inventors: Uday B. Pal, Dover, MA (US); Soumendra Basu, Westwood, MA (US); Paul Gasper, Watertown, MA (US); Yanchen Lu, Boston, MA (US); Srikanth Gopalan, Westborough, MA (US)

(73) Assignee: The Trustees of Boston University, Boston, MA (US)

( * ) Notice: Subject to any disclaimer, the term of this patent is extended or adjusted under 35 U.S.C. 154(b) by 0 days.

(21) Appl. No.: 15/654,152

(22) Filed: Jul. 19, 2017

(65) Prior Publication Data
US 2018/0023211 A1    Jan. 25, 2018

Related U.S. Application Data

(60) Provisional application No. 62/364,757, filed on Jul. 20, 2016.

(51) Int. Cl.
| | | |
|---|---|---|
| C25D 17/10 | (2006.01) | |
| C23C 14/02 | (2006.01) | |
| C23C 14/18 | (2006.01) | |
| C23C 14/22 | (2006.01) | |
| C25D 7/00 | (2006.01) | |
| C23C 14/00 | (2006.01) | |
| C23C 14/04 | (2006.01) | |
| C23C 14/08 | (2006.01) | |
| H01M 8/00 | (2016.01) | |

(52) U.S. Cl.
CPC .......... *C25D 17/10* (2013.01); *C23C 14/0021* (2013.01); *C23C 14/02* (2013.01); *C23C 14/046* (2013.01); *C23C 14/083* (2013.01); *C23C 14/18* (2013.01); *C23C 14/228* (2013.01); *C25D 7/006* (2013.01); *H01M 8/00* (2013.01)

(58) Field of Classification Search
CPC .. H01M 4/8842; H01M 4/8846; H01M 4/885; H01M 4/8867; H01M 4/8885; C23C 14/228
See application file for complete search history.

(56) References Cited

U.S. PATENT DOCUMENTS

| | | |
|---|---|---|
| 5,262,199 A | 11/1993 | Desu et al. |
| 2007/0072035 A1 | 3/2007 | Korevaar et al. |
| 2008/0193803 A1 | 8/2008 | Sholklapper et al. |

(Continued)

OTHER PUBLICATIONS

International Search Report and Written Opinion for PCT Application No. PCT/US2017/042774 dated Nov. 20, 2017 (20 pages).

*Primary Examiner* — James Lee
(74) *Attorney, Agent, or Firm* — Wilmer Cutler Pickering Hale and Dorr LLP

(57) ABSTRACT

A method of preparing a metal nanoparticle on a surface includes subjecting a metal source to a temperature and a pressure in a carrier gas selected to provide a vapor metal species at a vapor pressure in the range of about $10^{-4}$ to about $10^{-11}$ atm; contacting the vapor metal species with a heated substrate; and depositing the metal as a nanoparticle on the substrate.

19 Claims, 14 Drawing Sheets

(56) References Cited

U.S. PATENT DOCUMENTS

2013/0273246 A1* 10/2013 Chisholm .............. C23C 16/18
427/212
2016/0028091 A1 1/2016 Hwang et al.

* cited by examiner

Fig. 11
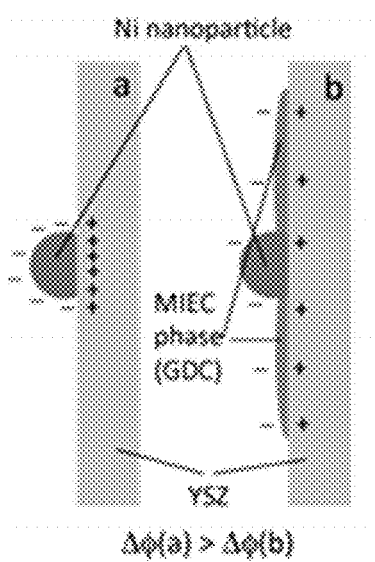
Fig. 12A    Fig. 12B
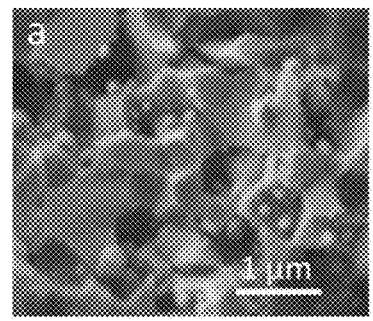 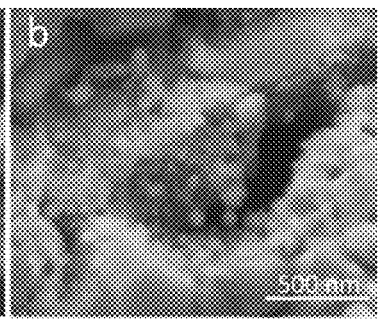

NANOPARTICLE DEPOSITION IN POROUS AND ON PLANAR SUBSTRATES

RELATED APPLICATION

This application claims the benefit of priority to U.S. Application No. 62/364,757, filed Jul. 20, 2016, the contents of which are incorporated by reference.

GOVERNMENT SUPPORT

This invention was made with government support under Grant No. DE-FE0026096 awarded by The Department of Energy. The government has certain rights in the invention.

INCORPORATION BY REFERENCE

All patents, patent applications and publications cited herein are hereby incorporated by reference in their entirety. The disclosures of these publications in their entireties are hereby incorporated by reference into this application in order to more fully describe the state of the art as known to those skilled therein as of the date of the invention described herein.

TECHNICAL FIELD

The present disclosure relates generally to systems and methods for nanoparticle deposition and to substrates including deposited nanoparticles. In particular, in some embodiments, the present disclosure relates to deposition of nanoparticles in porous and on planar substrates and to porous and planar substrates including the deposited nanoparticles.

BACKGROUND

There has been a substantial effort to decrease the operation temperatures of solid oxide fuel cells (SOFC) to intermediate temperatures (600-800° C.). However, lower temperatures are accompanied by slower kinetics leading to increased polarization losses, and lowering of the power density of the cells. Research has focused on the cathode and electrolyte, while in most cases, the anode has remained as a Ni/YSZ cermet, highlighting the effectiveness of Ni as a catalyst for the oxidation reaction occurring at the TPBs of the anode. However, in most of the single-cell studies reported, highly fuel rich conditions (typically $H_2$-3% $H_2O$) have been used, corresponding to very low fuel utilization rates. However in a fuel cell stack, the fuel utilization in a stack can easily reach over 85%, at which point the fuel is in a highly oxidized state with over 85% $H_2O$. The anodic polarization increases substantially when the utilization rate increases (i.e., the $H_2O$ content in the fuel increases). For economic reasons, fuel cells have to be run under high fuel-utilization conditions such that a substantial part of the fuel is used up and not expelled with the anode exhaust.

It is very difficult to infiltrate porous electrode substrates with nanocatalyst particles. Conventional methods are generally based on liquid phase infiltration. These liquid phase infiltration methods are time consuming, requiring multiple infiltration steps followed by drying and heating steps. Even after this time-consuming process, the particle loading that may be achieved using liquid infiltration is significantly less than what is desired.

SUMMARY

Some embodiments disclosed herein relate to using a gas infiltration process to deposit nanoparticles in porous and on planar substrates. Gas phase infiltration for deposition of nanoparticles has not previously been suggested or attempted. In some embodiments, the metal (e.g., Nickel) is turned to gaseous form that includes a desired concentration (e.g., in the parts-per-million (PPM) or parts-per-billion (PPB) range) of the metal species (e.g., metal hydroxyl species). In some embodiments, a temperature gradient is selected to deposit the metal species as nanoparticles. In some embodiments, an electric bias potential is selected to deposit the metal species as nanoparticles. In some embodiments, the deposition process is mediated by a water vapor containing gas (e.g., water vapor in a gas carrier) and/or low pressures (e.g., pressures less than about 0.1 atmospheres). In some embodiments, the low-pressure aids in the infiltration of gaseous species within the porous substrates.

In one aspect, porous anodes having infiltrated nanoparticles are provided that are functional at intermediate temperatures and also capable of maintaining high power densities at high fuel utilizations, e.g., high water vapor concentrations in the fuel.

In one aspect, a method of preparing a metal nanoparticle in or on a surface includes subjecting a metal source to a temperature and a pressure in a carrier gas selected to provide a vapor metal species at a vapor pressure in the range of about $10^{-4}$ to about $10^{-11}$ atm; contacting the vapor metal species with a heated substrate; and depositing the metal as a nanoparticle on the substrate.

The method of claim 1, wherein the metal vapor species are deposited thermally as a nanoparticle.

In one or more embodiments, the metal vapor species are deposited electrolytically as a nanoparticle.

In one or more embodiments, the deposited nanoparticles have a dimension in the range of 5 nm to 500 nm.

In one or more embodiments, the metal species comprises one or more of vaporized metal, metal oxyhydroxides and metal hydroxides.

In one or more embodiments, the substrate is porous.

In one or more embodiments, the nanoparticles deposit within pores of the porous substrate.

In one or more embodiments, the porous substrate comprises pores in the range of about 1 μm to about 1 mm.

In one or more embodiments, the carrier gas comprises water vapor.

In one or more embodiments, the metal is selected from the group consisting of nickel, iron, copper, cobalt, chromium, magnesium, tungsten, or manganese and combinations thereof.

In one or more embodiments, thermally depositing includes heating the metal source at a first higher temperature and maintaining the substrate at a second lower substrate, wherein the vapor metal species decompose on contacting the substrate to deposit the metal nanoparticles.

In one or more embodiments, electrolytically depositing includes applying a voltage at the substrate to reduce the vapor metal species to metal.

In one or more embodiments, the metal vapor species is oxygen-containing.

In one or more embodiments, the substrate is at a temperature selected to maintain the vapor metal species in a vapor state.

In one or more embodiments, the substrate is a porous anode of a solid oxide fuel cell.

In one or more embodiments, the substrate is a solid support of a heterogeneous catalyst.

Any embodiment described herein is readily combinable with one or more other embodiments.

In another aspect, a method of depositing metal nanoparticles in a porous electrode of a solid oxide fuel cell, includes heating a metal source to a first temperature selected to vaporize the metal source; flowing a carrier gas over the heated metal source, wherein the carrier gas interacts with the vaporized metal and forms a metallic species gas phase having a vapor pressure in the range of about $10^{-4}$ to about $10^{-11}$ atm; directing the metallic species gas towards a surface of a solid oxide fuel cell, wherein the surface comprises a porous electrode of the solid oxide fuel cell, and wherein the solid oxide fuel cell is independently heated to a second temperature that is less than the first temperature; and decomposing the metallic species to deposit nanoparticles of the source metal.

In one or more embodiments, the electrode is an anode.

In one or more embodiments, the anode is selected from the group consisting of Ni-GDC, Ni-GSTA, Ni-YSZ-co-infiltrated with GDC, Ni-YSZ-co-infiltrated with GSTA, and Ni-YSZ.

In one or more embodiments, the anode further comprises an electronic oxide or mixed electronic ionic conductor (MIEC).

In one or more embodiments, the electronic oxide comprises gadolinia-doped ceria (GDC) or gadolinia-doped strontium titanate (GSTA).

In one or more embodiments, the electronic oxide or mixed electronic ionic conductor (MIEC) is located in the anode active layer (AAL).

In one or more embodiments, the deposited metal has nickel particle density in the range of 10 to 100 per $\mu m^2$, and/or the TPB is in the range of 5-100 $\mu m/\mu m^3$, and/or the particle volume is in the range of 0.1 to 10 $nm^3/nm^2$.

In one or more embodiments, the deposited nickel nanoparticles deposit preferentially on the YSZ, GDC and/or GSTA.

In one or more embodiments, the nanoparticles deposit at the triple phase boundary of the porous electrode.

In one or more embodiments, the triple phase boundary of the electrode increases with deposition of the metal nanoparticles.

In one or more embodiments, the triple phase boundary of the electrode increases by a factor of 1.5×, or 2× or 2.5× or up to 10×.

In one or more embodiments, the method further includes prior to deposition, heating the solid oxide fuel cell under reducing conditions, wherein nickel oxide present in the anode is reduced to nickel.

In one or more embodiments, the deposited nanoparticles have a dimension in the range of 5 nm to 500 nm.

In one or more embodiments, the nanoparticles deposit within pores of the porous substrate.

In one or more embodiments, the porous substrate comprises pores in the range of about 1 $\mu m$ to about 1 mm.

In one or more embodiments, the carrier gas comprises water vapor.

In one or more embodiments, the metal nanoparticles deposit in an anode active layer (AAL).

In one or more embodiments, the solid oxide fuel cell is located in a furnace configured for operation as a solid oxide fuel cell.

In one or more embodiments, the furnace comprises an air side and a fuel side and conduits are provided for supplying a hydrogen fuel to the fuel side and oxygen to the air side.

In one or more embodiments, the method further includes removing the metal source after deposition of the metal nanoparticles and operating the solid oxide fuel cell to generate electricity.

Any embodiment described herein is readily combinable with one or more other embodiments.

In another aspect, a method of depositing metal nanoparticles in a porous electrode of a solid oxide fuel cell, includes heating a metal source to a first temperature selected to vaporize the metal source; flowing a carrier gas over the heated metal source, wherein the carrier gas interacts with the vaporized metal and forms a metallic species gas phase having a vapor pressure in the range of about $10^{-4}$ to about $10^{-11}$ atm, wherein the metallic species comprises oxygen; directing the metallic species gas towards a surface of a solid oxide fuel cell, wherein the surface comprises a porous electrode of the solid oxide fuel cell, and wherein the solid oxide fuel cell is independently heated to a second temperature that is selected to maintain the metallic species in the gas phase; and applying an electric bias to the electrode to extract oxygen from the metallic species and to deposit the metal as nanoparticles.

In one or more embodiments, the electrode is an anode.

In one or more embodiments, the anode is selected from the group consisting of Ni-GDC, Ni-GSTA, Ni-YSZ-co-infiltrated with GDC, Ni-YSZ-co-infiltrated with GSTA, and Ni-YSZ.

The method of claim 38, wherein the anode further comprises an electronic oxide or mixed electronic ionic conductor (MIEC).

In one or more embodiments, the electronic oxide comprises gadolinia-doped ceria (GDC) or gadolinia-doped strontium titanate (GSTA).

In one or more embodiments, the electronic oxide or mixed electronic ionic conductor (MIEC) is located in the anode active layer (AAL).

In one or more embodiments, the deposited metal has nickel particle density in the range of 10 to 100 per $\mu m^2$, and/or the TPB is in the range of 5-100 $\mu m/\mu m^3$, and/or the particle volume is in the range of 0.1 to 10 $nm^3/nm^2$.

In one or more embodiments, the deposited nickel nanoparticles deposit preferentially on the YSZ, GDC or GSTA.

In one or more embodiments, the method further includes prior to deposition, heating the solid oxide fuel cell under reducing conditions, wherein nickel oxide present in the anode is reduced to nickel.

In one or more embodiments, the deposited nanoparticles have a dimension in the range of 15 nm to 500 nm.

In one or more embodiments, the nanoparticles deposit within pores of the porous substrate.

In one or more embodiments, the metal nanoparticles deposit in an anode active layer (AAL).

In one or more embodiments, the nanoparticles deposit at the triple phase boundary of the porous electrode.

In one or more embodiments, the triple phase boundary of the electrode increases with deposition of the metal nanoparticles.

In one or more embodiments, the triple phase boundary of the electrode increases by a factor of 1.5×, or 2× or 2.5×.

Any embodiment described herein is readily combinable with one or more other embodiments.

In another aspect, a solid oxide fuel cell, includes a porous metal oxide cathode; a metal oxide electrolyte; and a porous nickel/electronic metal oxide anode, the anode comprising nickel-nanoparticles deposited at least at the triple phase boundary of the anode.

In one or more embodiments, the anode further comprises an electronic oxide or mixed electronic ionic conductor (MIEC) in contact with the nickel nanoparticles.

In one or more embodiments, the fuel cell further includes a layer of an electronic oxide over the nickel nanoparticles.

The fuel cell of claim 52 or 53, wherein the cathode is selected from $La_{1-x}Sr_xMnO_3$ (LSM) based electronic and $La_{1-x}Sr_xCo_yFe_{1-y}O_3$ (LSCF) or $La_{1-x}Sr_xFeO_3$ (LSF) based mixed conducting cathodes.

In one or more embodiments, the anode is selected from the group consisting of Ni-GDC, Ni-GSTA, Ni-YSZ-co-infiltrated with GDC, Ni-YSZ-co-infiltrated with GSTA, and Ni-YSZ In one or more embodiments, the electrolyte is selected from Zirconia stabilized with yttria or scandia or calcia or magnesia, etc.

In one or more embodiments, the electronic oxide layer has a thickness in the range of 1 nm to 10 nm.

In one or more embodiments, the electronic oxide comprises gadolinia-doped ceria (GDC) or gadolinia-doped strontium titanate (GSTA).

Any embodiment described herein is readily combinable with one or more other embodiments.

These and other aspects and embodiments of the disclosure are illustrated and described below.

BRIEF DESCRIPTION OF THE DRAWINGS

The invention is described with reference to the following figures, which are presented for the purpose of illustration only and are not intended to be limiting.

In the Drawings:

FIG. 11 is a schematic illustration showing the reduction in electric field by addition of a mixed ionic-electronic conductor in the anode.

FIG. 12A is a scanning electron photomicrograph of vapor phase deposited nanoparticles in a Ni/YSZ/GDC AAL after operation for 24 hours at 800° C.

FIG. 12B is a scanning electron photomicrograph of liquid phase co-deposited nanoparticles of Ni and GDC in a Ni/YSZ AAL.

DETAILED DESCRIPTION

Some embodiments disclosed herein relate to nanoparticles of metals, alloys and their oxides that can be deposited on planar or porous substrates and to the processes for deposition of these nanoparticles. In some embodiments, such nanoparticle deposition inside porous electrodes can function as catalysts and lower losses and improve device performance.

In some embodiments, the nanoparticles, and the processes for deposition of these nanoparticles may be applicable to, for example, but not limited to, fuel cells, batteries, and thermal barrier coatings. In some embodiments, the nanoparticles, and the processes for deposition of these nanoparticles can be used to deposit metal catalysts, and for example, can be used to deposit metal catalysts on solid porous supports. In one or more embodiments, the triple phase boundary length for a metal infiltrated anodes of an SOFC is increased as compared to a non-infiltrated SOFC. In some embodiments, the triple phase boundary of the electrode increases by a factor of 1.5×, or 2× or 2.5×. Vapor phase infiltrated porous anodes exhibit properties that are superior to liquid phase infiltrated anodes. Liquid Phase Infiltration is time consuming, difficult to get full penetration unless the NiO in the anode composite (YSZ-NiO) is reduced and it requires several heating and cooling steps. Vapor phase infiltration (VPI) involves reduction of the NiO in the anode composite at the SOFC operating temperature prior to VPI. It is in-situ and does not require any additional steps. The end product in liquid phase infiltrated substrate is more susceptible to cracking when the SOFC is finally heated to its operating temperature.

Some embodiments disclosed herein relate to nanoparticle deposition inside porous substrates that is mediated by gas phase infiltration. Some embodiments disclosed herein relate to porous substrates that include nanoparticles deposited by gas phase infiltration.

In one or more embodiments, a metal-containing vapor is formed by flowing a carrier gas with optional water vapor over a metal source at elevated temperatures. The metal-containing vapor is transported to a substrate, such as a porous substrate, where the metal-containing vapor deposits and forms metal nanoparticles. When the substrate is porous, the metal nanoparticles can be deposited both on the surface and within the porous structure. The concentration of the metal-containing species in the gas phase is controlled to provide nanoparticles. In one more embodiments, the metal-containing species has a partial pressure in the gas phase in the range of $10^{-4}$ to about $10^{-11}$ atm. Deposition to generate the nanoparticles can be carried out thermally or electrolytically.

Figure 1:
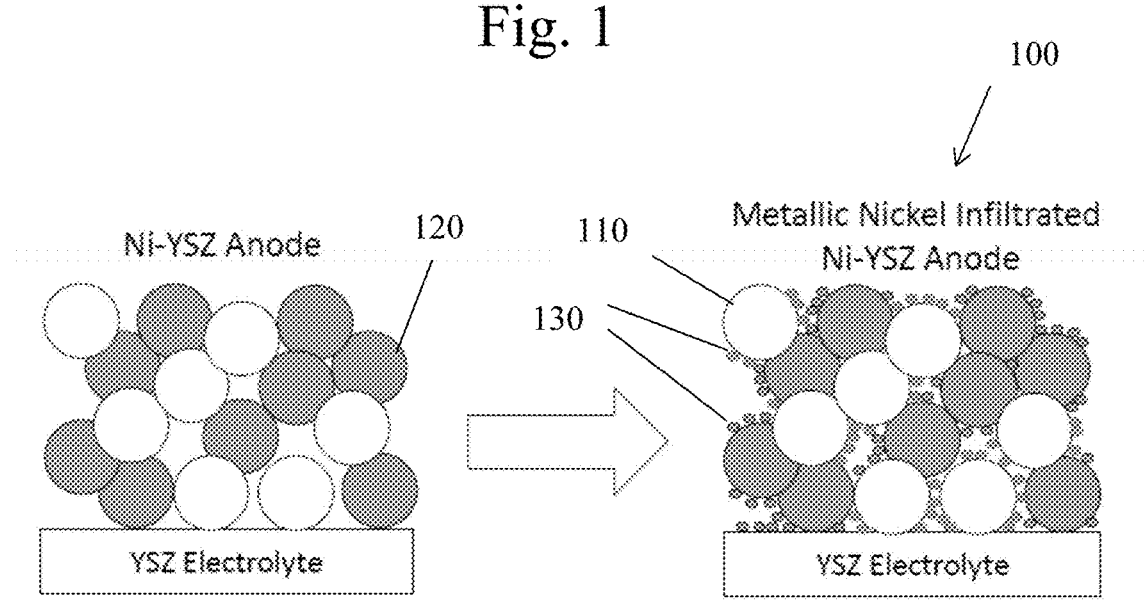
FIG. 1 is a schematic illustration of nickel nanoparticle deposition into a nickel/yttrium-stabilized zirconia cermet using gas phase infiltration according to one or more embodiments.

FIG. 1 is a schematic illustration of gas phase infiltration into an exemplary porous substrate 100 (here nickel/yttrium-stabilized zirconia porous composite) to deposit nanoparticles of a metal 130 (here nickel) in and on the porous anode structure. The nickel particles 120 (grey) and YSZ particles 110 (white) of the anode form a porous network in which there is a percolating network of nickel particles. On gas phase infiltration, nickel nanoparticles deposit on both the Ni and YSZ particles of the anode.

In some embodiments, high temperatures (e.g., temperatures at or above the vaporization temperature of the metal), lower pressures (e.g., pressures below about 0.1 atmospheres) and/or water vapor containing gases can facilitate volatilization of desired metals. In some embodiments, conditions can be selected such that the vapor species containing the desired metal are present in very small concentrations (e.g., PPM and PPB levels, or for example at metal species concentrations of about $10^{-4}$ to about $10^{-11}$ atm, or about $10^{-5}$ to about $10^{-10}$) in the gas phase. While not bound by any particular mode of operation, it is hypothesized that maintaining the metal species concentration in this range provides sufficient material for particle formation, but avoids deposition of large, e.g., macroscale, particles and coarsening of the particles. Large particles and excessive particle deposition can undesirably clog pores and imped fluid flow through the porous substrate. Also, larger particles have a reduced surface area, which can have a negative impact on some electrochemical processes. In some embodiments, lower pressures can facilitate infiltration of gaseous species within the porous substrates. In some embodiments, when the gas phase is cooled in a controlled manner it can result in the deposition of the desired metal as nanoparticles.

In some embodiments, metal nanoparticles are formed via thermal evaporation in a controlled gas environment including, for example, argon, and hydrogen (forming gas) at temperatures near the melting point of the metal source. In some embodiments, the metal source and substrate are contained within a dense alumina tube maintained at a desired pressure, sealed from outside gases, and heated by a tube furnace. Continuous flow of the gas can transport metal vapor to colder regions where the substrate is placed. Metal deposition from the supersaturated vapor occurs on or within the substrate due to this temperature gradient.

The concentration of the metal in the gas phase can be increased by increasing the water vapor content and/or by lowering the total pressure. The presence of water vapor can increase the concentration of reaction products such as metal oxyhydroxides and metal hydroxides in the vapor phase. In one or more embodiments, oxides, oxyhydroxides, hydroxides and other volatile hydroxyl species of the target metal (hereinafter referred to as "hydroxides" or "metal hydroxides") are decomposed to deposit metal nanoparticles. Continuous flow of the gas can transport metal hydroxides vapor to colder regions where the substrate is placed. Metal deposition from the supersaturated metal hydroxides vapor occurs on or within the substrate due to this temperature gradient. Metal deposition can occur with the decomposition of the metal oxyhydroxides and metal hydroxides to metal at the lower substrate temperatures.

Infiltration of the vapor phase and subsequent deposition within the porous substrate can be enhanced by lowering the total pressure (e.g., to a temperature below about 1 atmosphere) in the system. In some embodiments, a lower total pressure increases the diffusivity of the vapor species within the porous substrate.

In some embodiments, water vapor containing gases and/or low pressures (e.g., pressures below about 0.1 atmosphere, or about $10^{-1}$ to about $10^{-6}$ atm) enable volatilization of metal species in controlled amounts (PPM and PPB levels) at high temperatures, and the deposition of the metal species as nanoparticles can be facilitated at lower temperatures by imposing a temperature gradient. In some embodiments, for porous substrates, the lower pressure also facilitates vapor phase infiltration of the metal containing gaseous species and results in subsequent deposition of the metal species within the porous substrate. Water vapor content can be in the range of 10 mol % and 95 mol % of the carrier gas (balance is an inert gas or forming gas). Increasing water vapor content increases metal species concentration in the gas phase. In some embodiments, water vapor content is greater than or equal to 50 mol % and can be about 50 mol % to about 90 mol %.

Figure 2:
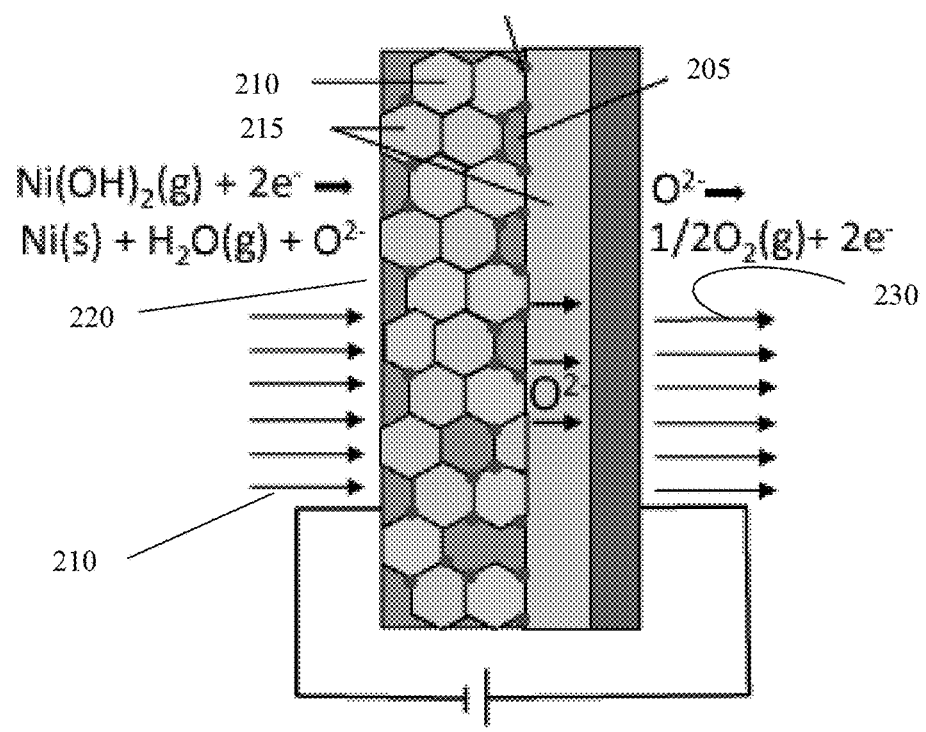
FIG. 2 is a schematic illustration of electrolytic deposition of nickel nanoparticles deposition into a nickel/yttrium-stabilized zirconia cermet according to one or more embodiments.

In some embodiments, the metal species in the gas phase are decomposed and deposited as nanoparticles using electrolytic processes 200, as exemplified in FIG. 2 with reference to the nickel nanoparticle deposition on nickel/yttrium-stabilized zirconia. Oxygen-containing species in the vapor phase are directed to a substrate, e.g., a porous substrate, that is subjected to an applied voltage. Under the applied bias, the oxygen-containing species are reduced to metal, which is deposited as metal nanoparticles. The applied voltage can be selected to be greater than the dissociation potential of the oxygen-containing species.

In an exemplary electrolytic process using nickel as the deposited metal, oxygen-containing metal species such as $Ni(OH)_2$ 210 are generated in the gas phase and are transported by carrier gas 210 to the substrate. In one or more embodiments, oxygen-containing metal species include oxides, oxyhydroxides, hydroxides and other volatile hydroxyl species of the target metal (e.g., "metal hydroxides"). Metal hydroxides vapor is formed either by reacting water vapor with the metal as described herein above for thermal decomposition, or by heating metal hydroxide above its melting point and using a carrier gas to deliver the vapor to the substrate 220. Metal nanoparticles can be deposited onto the target substrate by application of an electric field. Here, the substrate 220 is a porous composite made up of nickel macroparticles 210, zirconia particles 215 and void 205. In the electrolytic process, oxygen 230 is removed from the oxygen-containing metal species while in the gas phase, and the metal is deposited on the substrate as nanoparticles. In one or more embodiments, the target substrate 220 is incorporated into an electrical circuit 250 so that the substrate is cathodically biased. Because the process occurs in the gas phase, the substrate can be maintained at a high temperature, e.g., at the same temperature as the metal source or at a temperature sufficiently high that thermal decomposition and/or other condensation does not occur.

In some embodiments, a metal, such as nickel, may be exposed to an inert gas that includes a water vapor at a high temperature (e.g., about 1400° C. for nickel). For example, nickel metal can evaporate, forming hydroxyl metal species, e.g., Ni, $NiO(OH)_2$, NiOH, $Ni(OH)_2$, which are present in low concentrations (e.g., PPM, PPB range). In some embodiments, one or more parameters is adjusted to obtain hydroxyl metal species in the PPM range, e.g., $10^{-5}$-$10^{-7}$. A vacuum may be pulled to help the vapor including the hydroxyl metal species infiltrate a porous substrate. The metal species condense at reduced temperatures (e.g., about 900-1000° C.) and deposit as nanoparticles inside the pores of a substrate (e.g., Ni/YSZ anode or a catalyst support). In some embodiments, the temperature of the anode is less than the temperature of the metal vaporization.

Figure 3:
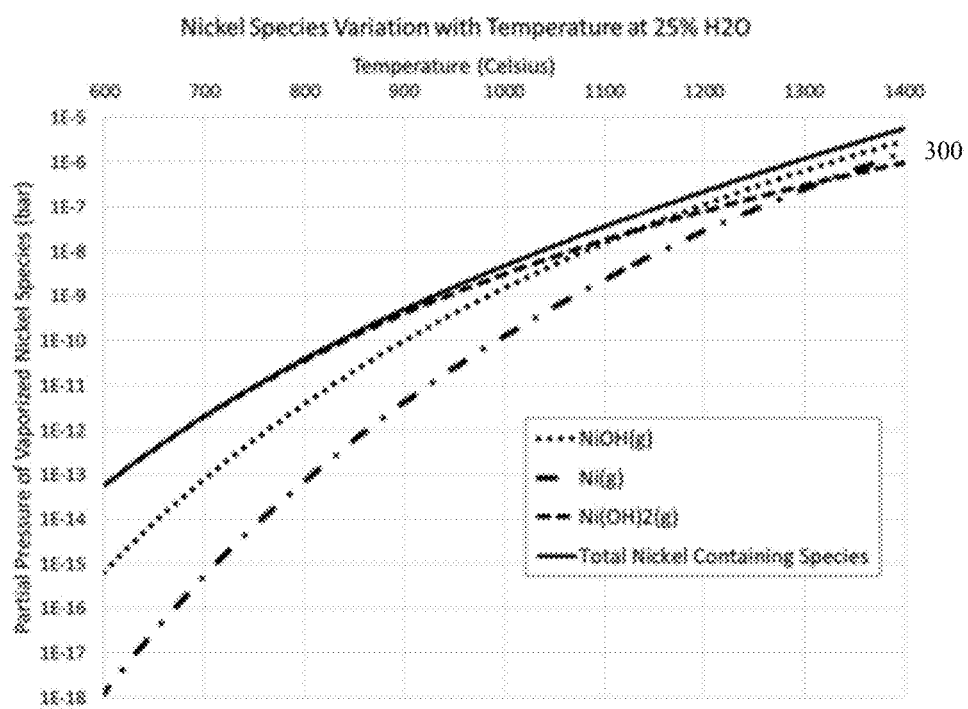
FIG. 3 is a plot showing equilibrium partial pressure of Ni-containing vapor phases in the presence of 75% forming gas (5% $H_2$, 95% Ar) and 25% water vapor in the presence of unlimited solid Ni.

Thermodynamic properties of a metal can provide guidance for selection of suitable processing conditions. For example, in the presence of water vapor, several Ni containing vapor phases are formed at high temperatures. Since the equilibrium partial pressures of these vapor phase species follow an Arrhenius relationship with temperature, creating these vapor phase Ni containing species at high temperatures, and condensing the metal into the anode microstructure at relatively lower temperatures is feasible. FIG. 3 show the equilibrium partial pressure of NiOH(g), Ni(g) and $Ni(OH)_2$(g) species as a function of temperature, as calculated by HSC Chemistry 6.0. FIG. 1 shows that reducing the temperature from 1400° C. to 900° C. leads to a ~$10^4$ reduction in the total partial pressure of all Ni containing vapor species. The Hertz-Knudsen equation shows that only a small surface area of solid Ni is needed for the vapor phase to reach equilibrium, indicating that the unlimited Ni supply assumption can be satisfied by a relatively small chunk of Ni at temperature in the presence of flowing forming gas/water vapor mixture.

Figure 4:
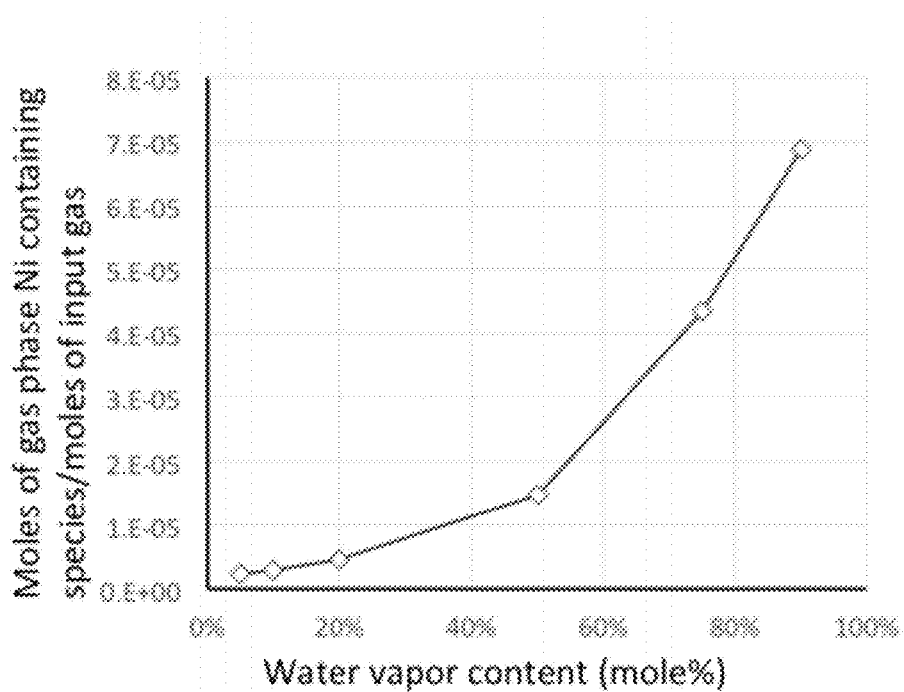
FIG. 4 is plot showing the effect of water vapor content on formation of Ni-containing vapor phase species at 1400° C.

It is also possible to evaluate the effect of water vapor on the vapor composition. FIG. 4 shows the effectiveness of water vapor content in the carrier gas to form vapor phase Ni species at 1400° C. Increasing water vapor in the carrier gas has a significant impact on the concentration of Ni containing species in the gas phase. The results in FIG. 4 are presented in Table 1, calculated for a 1000 ccm input gas flow rate over solid Ni at 1400° C. An increase of the water vapor content in the forming gas/water vapor gas mixture from 5% to 90% leads to a factor of 30 increase in the vapor phase Ni content.

TABLE 1

Nickel Vaporization as a function of water vapor.
Nickel Vaporization Rate (1000 ccm gas flow rate)

| Water vapor content | Grams nickel per minute |
|---|---|
| 5% | 5.92E-06 |
| 10% | 7.66E-06 |
| 20% | 1.20E-05 |
| 50% | 3.89E-05 |
| 75% | 1.13E-04 |
| 90% | 1.80E-04 |

Figure 5:
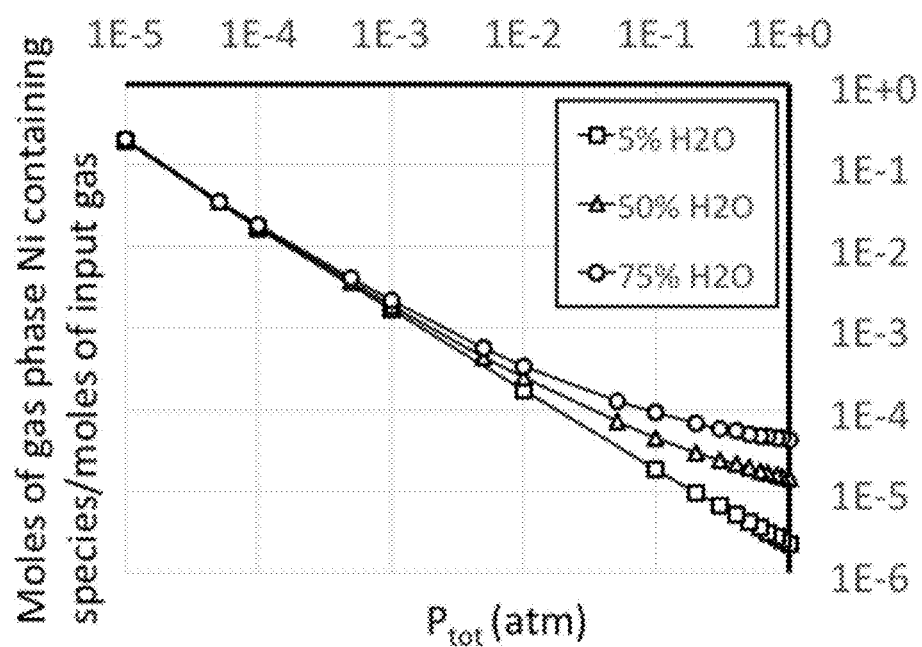
FIG. 5 is a plot showing the effect of total pressure on Ni-containing vapor phase formation at different water vapor content.

Similarly, the effects of pressure on the nickel gas phase can be used in the determination of appropriate gas infiltration conditions. FIG. 5 shows the effect of total pressure on the formation of vapor phase Ni species at different (fixed) water vapor content when flowed over Ni at 1400° C. FIG. 5 shows that there is a significant increase in the partial pressure of Ni-containing vapor phase species with decreasing total pressure. The data for 5% water vapor is summarized in Table 2, for a gas flow rate of 100 ccm over Ni at 1400° C.

TABLE 2

Effect of total pressure on Ni vaporization rate
Nickel Vaporization Rate (1000 ccm gas flow rate, 5% $H_2O$)

| Pressure (bar) | grams nickel per minute |
|---|---|
| 1 | 5.92E-06 |
| 0.01 | 4.52E-04 |
| 0.001 | 4.45E-03 |
| 0.0001 | 4.47E-02 |
| 0.00001 | 5.30E-01 |

Figure 6:
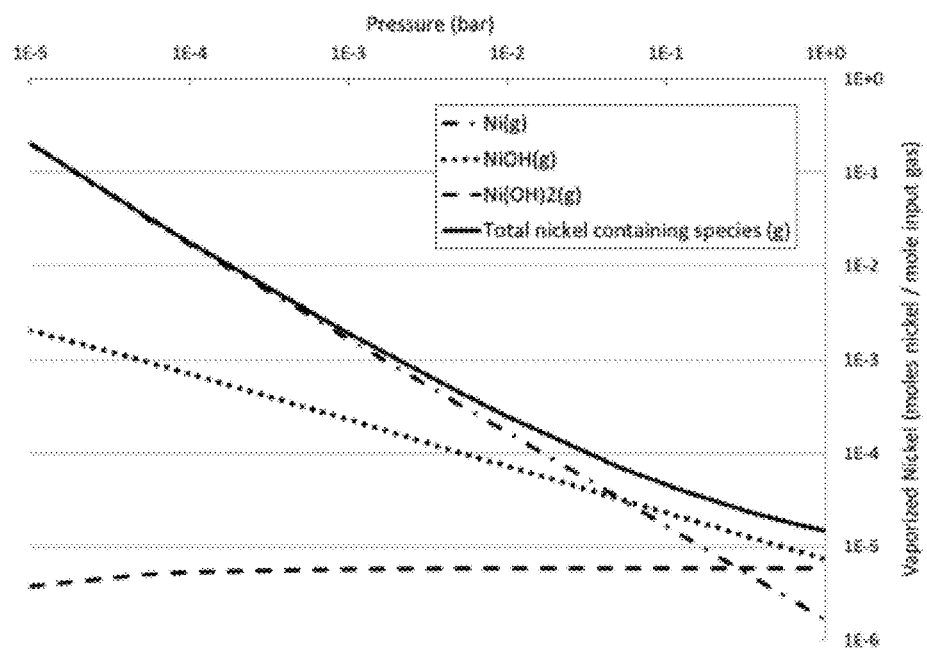
FIG. 6 is a plot showing the effect of total pressure on different Ni-containing species for a 50% water vapor gas mixture in the presence of solid Ni at 1400° C.

The curves in FIG. 5 all converge for different water vapor contents at low values of total pressure. This suggests that at low total pressure, the Ni(g) species dominates over Ni-containing species that are formed in the presence of water vapor (NiOH(g) and $Ni(OH)_2$(g)). FIG. 5 suggests that at low total pressures, water vapor may not be necessary to form significant Ni-containing vapor species. FIG. 6 shows that this is indeed the case, and that at low values of total pressure, the partial pressure of Ni(g) is several orders of magnitude larger than other Ni-containing species.

In some embodiments, the nanoparticles are deposited as pure metal. In some embodiments, the nanoparticles may be deposited as metal alloy (e.g., if the metal alloy is vaporized).

In some embodiments, the pores in the porous substrate are microscale (e.g., about 1 micron-1000 microns, e.g., 1-100 microns, 50-500 micron, 200-1000 microns). In some embodiments, the porous substrate may have a thickness around 1 mm, or around 1.5 mm, or any other suitable thickness. In some embodiments, the vapor including the metal hydroxyl species can penetrate through the entire thickness of the porous substrate. In some embodiments, the nanoparticle deposition is even throughout the thickness of the porous substrate. Deeper penetration can be obtained by increasing the flow rate and or decreasing the pressure.

In some embodiments, the deposited nanoparticles have dimensions between about 15 nm to about 500 nm. In some embodiments, the nanoparticles have any suitable dimensions. Particle density desired is 10 to 100 nanoparticles per $\mu m^2$, and/or the TPB is 5-100 $\mu m/\mu m^3$, and/or the particle volume needs to be 0.1 to 10 $nm^3/nm^2$. In some embodiments, a high density (e.g., about 80% or higher coverage of the internal surface area with nanoparticles) may be obtained using the processes discussed herein.

In some embodiments, the anode (or any substrate onto which nanoparticles are deposited) may include two or more kinds of particles (e.g., nickel and zirconia particles). In one or more embodiments, an electronic oxide (or mixed electronic ionic conductor (MIEC)) such as gadolinia-doped ceria (GDC) or gadolinia-doped strontium titanate (GSTA) is incorporated in the anode layer. In some embodiments, the particles onto which the nanoparticles are deposited may have dimensions on the order of about 1 to about 5 microns. In some embodiments, nickel nanoparticles deposit on zirconia particles (e.g., rather than on nickel nanoparticles). Some embodiments discussed herein relate to selectively depositing nanoparticles onto a selected material (e.g., a selected material of a heterogeneous composite). In some embodiments, nanoparticles selectively deposit on higher surface energy components (e.g., nickel nanoparticles selectively deposit zirconia particles). While not bound by any particular mode of operation, nanoparticles may bind to higher surface energy components to lower overall surface energy. In one or more embodiments, more than 50% and up to 90% of the nanoparticles deposit on the zirconia particles.

Although the process is demonstrated for Ni nanoparticle deposition, it is understood that the same or similar process can be used with any other similar transition metal or other metal as a source material, such as, for example, iron, copper, cobalt, magnesium, tungsten, or manganese. The appropriate conditions for vaporization of a metal can be determined based on the thermodynamic properties of the particular metal. For example, for more volatile metals such as magnesium or calcium, lower temperatures and higher pressures can be used (as compared to the examples presented herein for nickel, for example). In examples where it is desired to increase partial pressure of the metallic species, higher temperatures and lower pressures can be selected. Increasing water vapor content of the carrier gas will also increase the concentration of hydroxyl metal species. Phase diagrams for metal and metal hydroxides at various water vapor pressures can be used as a reference in determining suitable conditions for metal nanoparticle deposition.

Application in a Solid Oxide Fuel Cell

Figure 17:
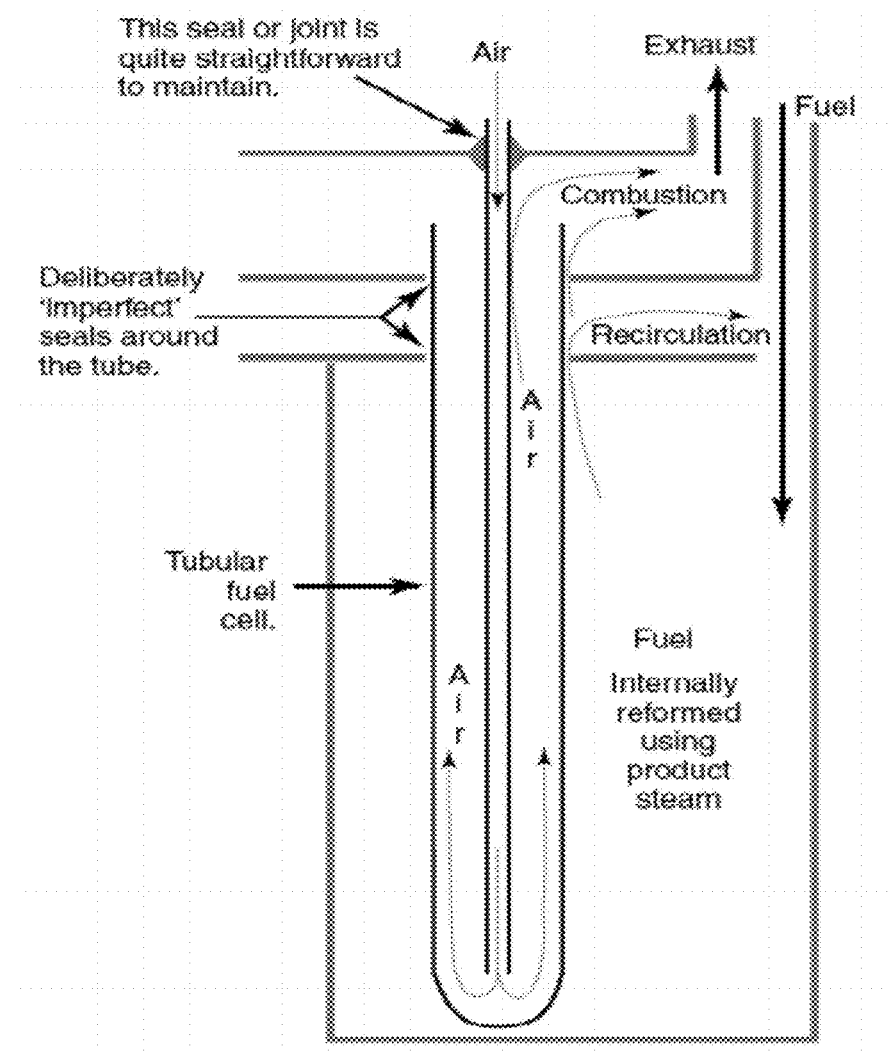
FIG. 17 is a schematic illustration of a typical tubular solid oxide fuel cell.
Figure 18:
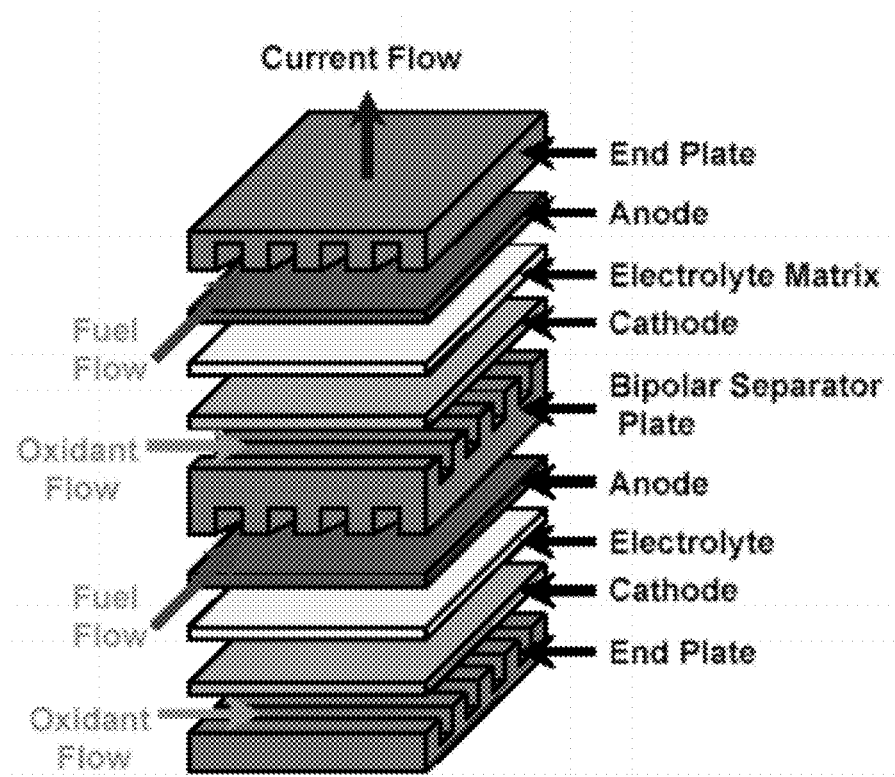
FIG. 18 is a schematic illustration of a stacked planar solid oxide fuel cell.

In one aspect, the method is used to deposit nanoparticles of electroactive metal in a porous electrode of a solid oxide fuel cell (SOFC). The solid oxide fuel cells can be assembled in a tubular or planar form. FIGS. 17 and 18 are schematic illustrations of typical tubular and stacked solid oxide fuel cells, respectively. The method can be used to deposit metal nanoparticles in a fuel cell of either configuration and/or in either the anode or the cathode, however, the particular metal selected may differ.

In one embodiment, the method is used to deposit nickel nanoparticles in a porous anode of an SOFC. It is of course readily understood that any suitable anode can be used. By way of example, the porous anode can be Ni-GDC, Ni-GSTA, Ni-YSZ-co-infiltrated with GDC, Ni-YSZ-co-infiltrated with GSTA, and Ni-YSZ. The inclusion of nanoparticles such as nickel nanoparticles in a Ni/YSZ anode can be used to increase the triple phase boundary (TPB) of the electrolyte, electrode, and fuel in a SOFC. FIG. 1 is a schematic illustration of gas phase infiltration into a Ni/YSZ anode 100 to deposit nanoparticles of nickel 110 in and on the porous anode structure. The nickel particles 120 and YSZ particles 130 of the anode form a porous network in which there is a percolating network of nickel particles. On gas phase infiltration, nickel nanoparticles can deposit on both the Ni and YSZ particles of the anode; however, deposition on the higher surface energy YSZ particles is preferred. The infiltrated particles do not need to be connected to contribute to the TPB length, however, only the nickel nanoparticles that form on YSZ will contribute to the TPB length. In one or more embodiments, the TPB length for a nickel infiltrated Ni/YSZ SOFC is increased as compared to a non-infiltrated SOFC. In some embodiments, the triple phase boundary of the electrode increases by a factor of 1.5×, or 2× or 2.5×.

In one or more embodiments, nickel particles deposit at a higher level on the YSZ particles. While not being bound by any particular mode of operation, it is hypothesized that the higher surface energy of the ceramic surfaces promotes nanoparticle deposition.

In one aspect, the infiltration the anode with fine Ni nanoparticle catalysts, provides an SOFC cell that maintains its performance at intermediate temperatures (600-800° C.) and high fuel utilization (up to 85% water vapor) where the fuel oxidation reaction at the triple phase boundaries (TPB) should compete with adsorbed water vapor species. The addition of Ni nanoparticles provides additional TPB boundary length. The infiltration process can deposit the particles in the most electroactive regions, e.g., the anode active layer (AAL). Desirably, the nanoparticles are stable against coarsening during long-term operation, and over a range of temperature conditions. At the upper end of the intermediate temperature range (ca. 800° C.), the performance at high fuel utilization is maintained over long periods by mitigating the instability of the Ni nanoparticles at this temperature. In the middle of the temperature range (ca. 700° C.), the performance is maintained at high fuel utilization. At the lower end of the temperature range (ca. 600° C.), where the performance of the cells is sometimes poor due to increased ohmic and polarization resistances, the cell performance can be improved by increasing the TPB sites. Ni nanoparticle instability is less of an issue under these conditions. SOFC cells with optimized anode microstructures according to one or more embodiments of the invention (and appropriate electrolyte and cathode) can demonstrate i) long term performance improvements at high fuel utilization (85% water vapor) at 800° C. due to enhanced Ni nanoparticle stability, ii) sustained maximum power density of a least 1 $W/cm^2$ at 700° C. at high fuel utilization, and iii) sustained 50% improvement in maximum power density at 600° C. at high fuel utilization over an uninfiltrated cell. At the lower end of the intermediate temperature range (especially 600° C.), electrolyte (Sc-doped zirconia (ScSZ)) and cathode materials (LSCF/Sm-doped ceria (SDC) cathodes with GDC barrier layer) can be used In another aspect, a method for a vapor deposition process for infiltrating a porous anode is provided that is scalable and easily transferable to industry. Thermodynamic calculations for nickel metal discussed above show: i) the equilibrium partial pressure of Ni-containing species is reduced by a factor of $10^{-4}$ when the carrier gas is cooled from 1400° C. to 900° C.; ii) the vaporization rate of Ni heated to 1400° C. increases by a factor of 30, when the water vapor content in the carrier gas is increased from 5% to 90%; iii) at 1400° C. and 50% water vapor content of the carrier gas, it is possible to increase the Ni evaporation rate by a factor of $10^4$, when the total ambient pressure is reduced from 1 atm to $10^{-5}$ atm; however, at lower pressures, the vapor phase Ni species is predominantly Ni(g); and iv) it is possible to evaporate Ni at 1400° C. at rates ranging from $5\times10^{-1}$ to $5\times10^{-6}$ g/min by proper selection of the water vapor content, flow rate of the carrier gas, and ambient pressure.

In one or more embodiments, parameters such as the temperature of the Ni source, the temperature of the cell being infiltrated, the temperature gradient between the source (Ni) and sink (cell anode), the carrier gas flow rate, the ambient pressure inside the furnace tube (and hence inside the pores in the anode), etc., are selected to provide a desired rate of Ni deposition, as well as the size and distribution of the deposited Ni nanoparticles, and its uniformity within the anode microstructure.

In one or more embodiments, a method of preparing a nanoparticle infiltrated solid oxide fuel includes infiltrating the porous electrode layer after assembly of the SOFC anode/electrolyte/cathode composite. In some embodiments, the pores of the porous electrode are microscale (e.g., about 1 micron-1000 microns, e.g., 1-100 microns, 50-500 micron, 200-1000 microns). In some embodiments, the porous electrode may have a thickness around 1 mm, or around 1.5 mm, or any other suitable thickness. The composite assembly can include a porous anode such as porous Ni/YSZ anode. The zirconia serves to inhibit sintering of the metal particles and provides a comparable thermal expansion coefficient. In one or more embodiments, an electronic oxide (or mixed electronic ionic conductor (MIEC)) such as gadolinia-doped ceria (GDC) or gadolinia-doped strontium titanate (GSTA) is incorporated in the anode active layer. The composite assembly can also include an oxide ion-conducting ceramic material, such as zirconia, YSZ or other known oxides, can be used as the electrolyte. Films of oxide electrolytes can be reliably produced using cheap, conventional ceramic fabrication routes at thicknesses down to 15 μm. The specific conductivity of the electrolyte is desirably greater than 10'S/cm. This can be achieved at 500° C. for the electrolyte $Ce_{0.9}C_{0.1}O_{1.95}$, and at 700° C. for the electrolyte $(ZrO_2)_{0.9}(Y_2O_3)$. The anode is fused to the solid oxide electrolyte, and the electrolyte is fused to a porous cathode, such as strontium-doped lanthanum manganite (LSM) cathode. Interconnects for the cell include metals (stainless steels) or alloys that are compatible in terms of chemical stability and mechanical compliance (similar thermal expansion coefficients), as is known in the art.

The assembly can be prepared using conventional methods known to those of skill in the art. By way of example, a Ni/YSZ layer is prepared by tapecasting, followed by heating of the green body. Subsequent layers of solid electrolyte and cathode layer are tapecast. The assembled layers are then sintered to fuse the layers and in the process, nickel is oxidized to nickel oxide (NiO). The nickel oxide is reduced to metal prior to operation as a fuel cell. As is discussed herein, the reducing step can be carried out in conjunction with the gas phase infiltration process.

Figure 7:
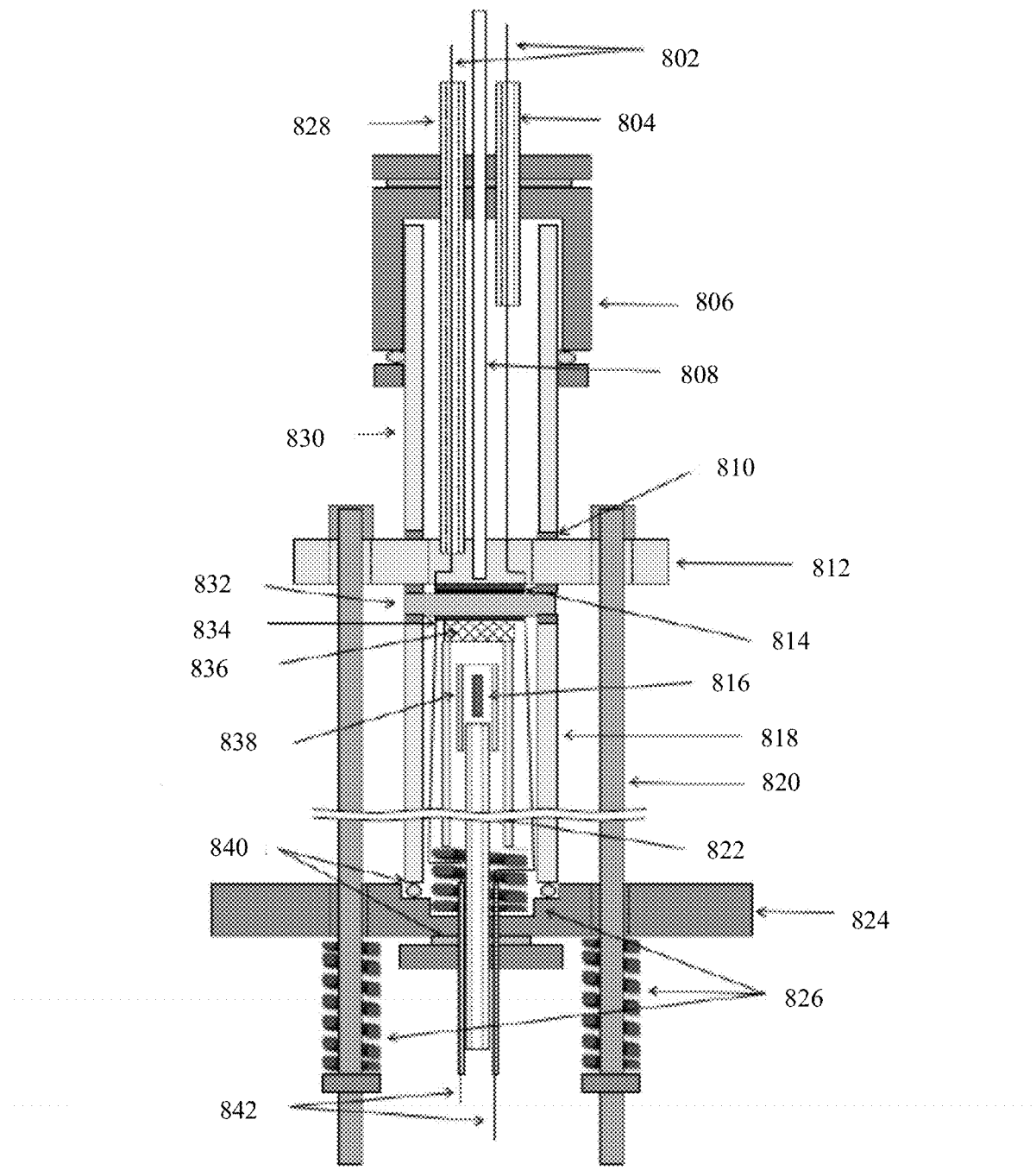
FIG. 7 is a schematic illustration of the assembly used for vapor phase infiltration of metal nanoparticles into a porous electrode of an SOFC according to one or more embodiments.
Figure 8:
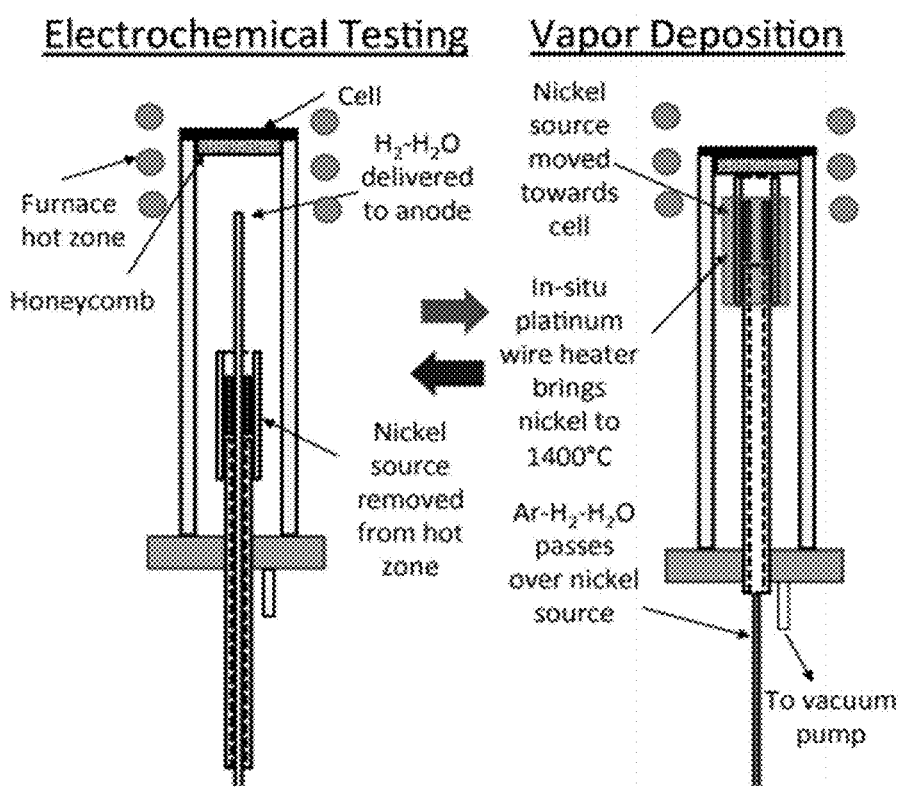
FIG. 8 is a schematic illustration of the positioning of the nickel metal source into and out of proximity of the SOFC, according to one or more embodiments.

The Ni deposition and electrochemical measurements of uninfiltrated and (the same) infiltrated cell can be made in the same setup, without having to cool the cell back down to room temperature between deposition and measurements, as shown in FIGS. 7 and 8. FIG. 7 is a schematic illustration of the apparatus used for vapor phase infiltration of the metal nanoparticles and electrochemical operation of the cell. While the discussion below refers to an anode-supported cell in which the porous anode faces the nickel source, it is contemplated that a cathode can be similarly infiltrated by exposing the cathode to the vapor source, and selecting the appropriate metal for nanoparticle formation.

The anode atmosphere is controlled by injecting water into a flow of hydrogen via a stainless-steel capillary tube. Water flow rate is controlled by a peristaltic pump. In this way anode atmosphere can be held constant at any relative water vapor partial pressure. This enables precise measurement of anode performance even at very high water vapor partial pressures. Spring load is applied onto the cell to ensure that the fuel side is completely gas sealed, and also to apply pressure on platinum meshes used as current collectors so that complete contact with the cell is achieved. The apparatus uses a 4-wire connection to the current collectors of the cell, two each on the cathode and anode. This allows OCV and current measurements to be conducted on separate leads for accurate measurement of cell ohmic resistance and cell performance under current load.

The assembly includes a movable Ni source (Ni chips) placed within a Pt wire heater. FIG. 8 shows a schematic of the experimental setup with a movable heater that allows for deposition and electrochemical testing of the same cell before and after infiltration. A cell with an unreduced NiO anode can be placed in the setup. The NiO in the anode is reduced and the cell can be electrochemically tested before vapor infiltration of Ni. Then the heater containing the Ni source (chips) will be raised up close to the anode and turned on. Water vapor containing carrier gas can then be introduced through the Ni chips for Ni nanoparticle deposition in the anode. Anode temperature, Ni source temperature, water vapor content and carrier gas flow rate can be controlled to provide desired nanoparticle deposition rate, particle size and size distribution. The heater containing the Ni source (chips) is maintained at a temperature greater than the substrate, so that the temperature differential favors decomposition and deposition of metal nanoparticles on the SOFC anode. By way of example, nickel deposition can be conducted using the Ni vapor source at 1100-1300° C.; a water vapor content of 50-90%; total pressure 1 atmosphere; and substrate temperature 700-1000 C.

In some embodiments, pulling a vacuum allows for very fast penetration into the porous substrate. In some embodiments, the vapor including the metal hydroxyl species can penetrate through the entire thickness of the porous electrode. In some embodiments, the nanoparticle deposition is even throughout the thickness of the porous electrode. In other embodiments, the Ni nanoparticle deposition occurs in a region closer to the nickel source, e.g., the anode active layer or AAL.

After deposition, the heater is turned off and lowered out of the furnace, and the infiltrated cell can be electrochemically tested. This ensures that the observed change in electrochemical performance is only due to the deposited Ni nanoparticles. The infiltrated SOFC can be used directly as a single cell or it can be integrated into a stacked cell SOFC, as is known in the art.

Electrolytic Deposition of Metal Nanoparticles in an SOFC

In another aspect, selective deposition of Ni nanoparticles in the existing TPBs of the uninfiltrated Ni/YSZ anode is accomplished in the presence of a nominal electric bias potential. With reference to FIG. 2, $Ni(OH)_2$ vapor can be formed either by reacting water vapor with Ni, or by heating pure $Ni(OH)_2$ above its melting point (230° C.), and using a carrier gas. The nickel hydroxide vapor is then transported to the fuel electrode (Ni-YSZ) side of the SOFC, while the fuel electrode is in a cathodically biased state. At the cathode, decomposition of $Ni(OH)_2$ takes place leading to the formation of oxygen ions, $O^{2-}$, which are then transported to the oxygen electrode (LSM or LSCF) side. Note that the designations of anode and cathode in the following refer to the bias direction in the deposition experiment, and not their SOFC functionality. The pertinent electrochemical reactions (for use of $Ni(OH)_2$ source) are:

$$\text{Cathode(Fuel electrode): } Ni(OH)_2(g)+2e^- \rightarrow Ni(s)+H_2O(g)+O^{2-} \tag{1}$$

$$\text{Anode(Air electrode): } O^{2-} \rightarrow \tfrac{1}{2}O_2(g)+2e^- \tag{2}$$

$$\text{This gives the overall reaction as: } Ni(OH)_2(g) \rightarrow Ni(s)+H_2O(g)+\tfrac{1}{2}O_2(g) \tag{3}$$

In one or more embodiments, $Ni(OH)_2$ evaporation temperature is selected to ensure sufficient vapor phase equilibrium partial pressure to provide reasonable deposition times. It is preferred to avoid gas phase decomposition of $Ni(OH)_2$ (i.e., maintain ΔG for Reaction 3>0), since metallic Ni in the vapor phase will not respond to the bias voltage for targeted TPB deposition. In one or more embodiments, the bias voltage is selected so that the overall Reaction 3 to occur does not occur, but only electrochemically as the sum of Reactions 1 and 2, due to an additional electrochemical driving force at active regions in the anode, i.e., TPBs, which is precisely the location of the targeted particles. The deposition favors the TPB because deposition is an electrochemical process and the TPB is where the electrochemistry takes place. The deposition is highest at the YSZ electrolyte/anode interface, and decreases further away from the interface (anode interior) because the electrochemical activity decreases.

In one or more embodiments, partial pressures of Ni containing vapor species of the order of $10^6$ and higher can be used. For a pure $Ni(OH)_2$ source, the temperature can be 700° C. or above. At 700° C., $\Delta G°$ (Reaction 3)=−55,936 J/mole of $O_2$, giving $K_{eq}$ (=p($O_2$)*p($H_2O$)$^2$/p($Ni(OH)_2$)$^2$) to be ~$10^3$. If K>$K_{eq}$, the decomposition will not occur, a condition that can be controlled by fixing the p($O_2$) at $10^{-4}$ atm by using Ar containing 100 ppm oxygen as the carrier gas, and bubbling the gas through water at the appropriate temperature to also fix the p($H_2O$) at 0.1 (at 700° C., the water vapor decomposition is negligible and will not alter the p($O_2$) that is fixed at $10^{-4}$ atm). Application of a nominal cathodic bias voltage of around 0.3V will allow electrochemical decomposition of $Ni(OH)_2$ and Ni nanoparticle deposition at the electroactive TPBs.

Figure 9:
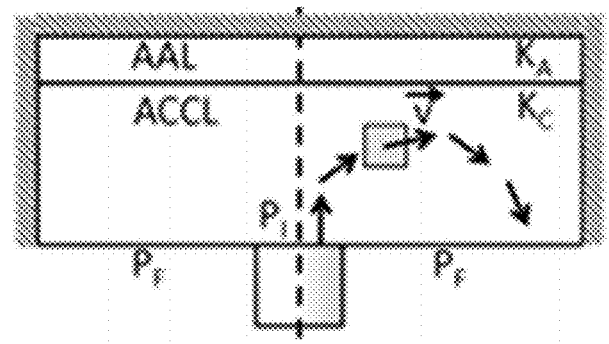
FIG. 9 is a schematic illustration of a model of deposition in anodes as fluid flow in a porous medium.

The vapor phase infiltration process can be modeled as deposition via fluid flow in porous media. The schematic of the axis-symmetric geometry is shown in FIG. 9 (center line is dashed). The anode current collector layer (ACCL, ~750 μm thick) and anode active layer (AAL, ~10 μm thick) are shown as two separate regions with permeability of $K_C$ and $K_A$, respectively. The permeability, K, of a porous media has been expressed as $$K = \frac{\phi^3}{\tau S_0^2 (1-\phi)^2}, \quad (4)$$

where ø is the pore fraction, $S_0$ is the surface area of pores per unit volume of solid material, and τ is a constant related to the pore tortuosity. These values are all quantitatively measured for the ACCL (by μ-CT) and AAL (by FIB/TEM). The boundary conditions do not allow any fluid flow from the top or the sides of the anode (due to the presence of a sealing electrolyte layer, shown shaded), while the input gas mixture is fed through the tube at the bottom at an input pressure $P_I$, which is larger than the ambient pressure in the furnace tube ($P_F$), allowing gas to exit in the annular space around the entry tube at the bottom of the anode after traversing the connected pore network in the anode. Since the local fluid velocity vector, $\vec{v}$, can be expressed in terms of the fluid viscosity, μ, as:

$$\vec{v} = \frac{K}{\mu} \nabla P, \quad (5)$$

the fluid velocity vector field can be mapped at any location within the porous anode (shown by arrows in FIG. 9) using COMSOL™ Multiphysics, for the given boundary conditions. The gas phase depletion due to Ni nanoparticle formation is assumed to be negligible. Defining $c_i$ as the gas phase concentration of phase i (moles of phase i per unit volume of gas), $C_i = c_i \phi$ corresponds to moles of gas phase i per unit volume of the porous media. Assuming that the fluid flow has reached steady state ($\dot{C}=0$), the concentration change of the Ni containing phase(s) in the differential volume in the porous anode (shown as square in FIG. 9) is due to mass transport as a result of convection and diffusion. Assuming that the rate of Ni deposition (and hence rate of gas phase depletion of Ni containing phase) is proportional ($1^{st}$ order) to the concentration of the Ni-containing vapor phase, and identical for all Ni containing gas phases (assumptions that we can experimentally verify and modify as necessary), mass balance of the Ni containing phase(s) (denoted by subscript 'd') in the differential volume dictates:

$$\nabla \cdot (C_d \vec{v} - D_d \nabla C_d) - K_d C_d \Psi = 0, \quad (6)$$

where $K_d$ is the rate constant of the Ni deposition process (which has an Arrhenius temperature dependence), $D_d$ is the gas phase diffusivity, and Ψ is the surface area of pores per unit volume of the porous anode (since Ni deposition can occur only on pore surfaces). The last term in Equation 6 is proportional to the amount of Ni deposition in the differential volume. Integrating over the entire anode volume gives the total amount of deposited Ni.

The assumption here is that for vapor infiltration, Ni deposition can occur anywhere on the pore surface. Effects such as preferential deposition on YSZ, nucleation of Ni, and temperature gradients in the furnace can be easily added to the model, as necessary. For field enhanced vapor deposition, $K_d$ can be modulated by the applied potential (Butler-Volmer type dependence), so that Ni deposition scales with the TPB length in the differential volume. Although the model makes several simplifying assumptions, it should nevertheless provide valuable insight into the relative effects of different deposition parameters (i.e., $P_I$, $P_F$, C (flow rate), $C_d$, T, etc.) on the rate and uniformity of Ni nanoparticle deposition, that can be used to guide experiments for optimization of the deposition process.

Figure 10:
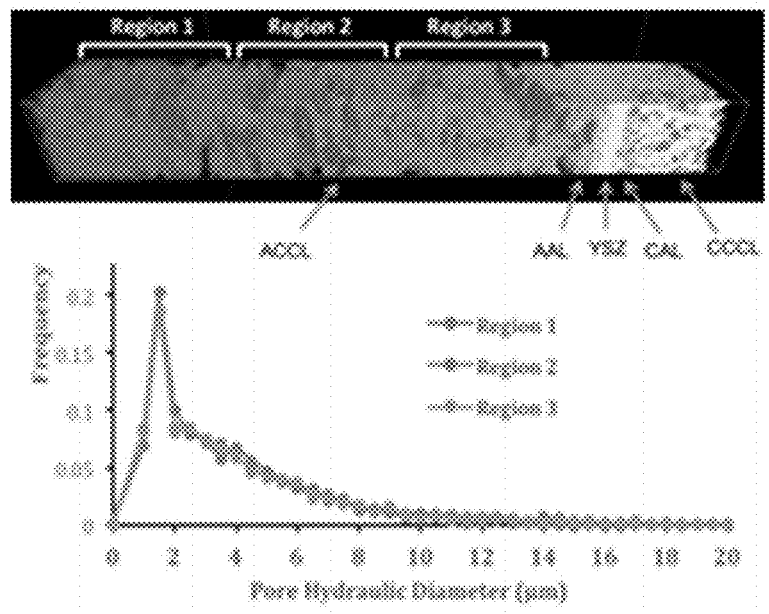
FIG. 10 shows the porosity distribution anode current collection layer (ACCL) as measured by μ-CT, showing uniformity of the anode pore distribution; photograph of the anode is shown in upper region of the figure with the corresponding pore diameter mapped to plot in lower portion of the figure.

The AAL can be characterized by FIB/SEM and the deposited Ni nanoparticles can be characterized by SEM observations of fracture cross-sections with image processing to get added TPB length due to nanoparticle deposition. The uniformity of the Ni nanoparticle distribution in the anode microstructure (AAL and ACCL), size distribution of the particles, and the appearance of any pore clogging due to excessive Ni deposition provide information on the TBP length. For purposes of modeling, the pore microstructure in the ACCL can be characterized by μ-CT (resolution of ~1 μm). FIG. 10 shows pore size distribution and indicates that the measured pore size distribution in three regions of the ACCL is quite similar. The pore fraction, average pore hydraulic diameter, and pore area per unit volume of the anode of the ACCL are listed in Table 3. The tortuosity of the ACCL was measured using a Floyd-Warshall algorithm, and the value was found to be in reasonable agreement with the tortuosity calculated from an independent gas diffusion experiment.

TABLE 3

| Properties of Reduced ACCL measured by μ-CT | |
|---|---|
| Measured pore fraction of reduced ACCL from μ-CT (ø) | 0.349 |
| Average pore hydraulic diameter in ACCL (μm) | 1.5 |
| Surface area of pores per unit volume of anode (Ψ) (μm$^2$/μm$^3$) | 1.11 |
| Measured tortuosity of ACCL from μ-CT | 2.71 |
| Calculated tortuosity from gas diffusion experiment | 3.64 |

Coarsening of nanoparticles due to surface curvature mediated specific surface area reduction is a well-known nanoparticle instability mechanism, which is referred to as 'physical instability'. It has been observed that extended operation of the SOFC cell, e.g., operation at 800° C. for more than 20 hours, resulted in the Ni nanoparticles disappearing only in the AAL right below the cathode, while remaining in all other regions of the anode. This mechanism is referred to as 'electrochemical instability'. Because of the large curvatures of the Ni nanoparticles there can be a large electrical potential gradient across the interface of the Ni nanoparticles at the electroactive TPBs in the AAL. While not being bound by any particular mode or explanation of operation, a large imbalance in charge densities may be formed across the interface and upon current discharge results in a large local current density that destabilizes the nanoparticles at the AAL electroactive TPB regions. This is not observed at all temperatures or for all materials. For example, at lower operating temperatures (600-700° C.), this phenomenon was not observed. At these lower temperatures, the discharge current density across the nickel nanoparticles is lower and therefore does not lead to electrochemical instability. In one or more embodiments, the cell is designed to operate at lower temperatures resulting in reduction of the large discharge current densities across the nickel nanoparticles leading to electrochemical instability. In other embodiments, metal nanoparticles having greater electrochemical stability can be used.

Ni nanoparticle size distributions can be characterized in electrochemically active regions (e.g., in AAL below the cathode) and electrochemically inactive regions (e.g., in AAL outside the cathode area). It is expected that in electrochemically inactive regions, the Ni nanoparticle instability mechanism, if any, will be physical, while the instability mechanism in the electrochemically active regions will be a combination of electrochemical and physical instabilities.

In one or more embodiments, electrochemical instability of the nanoparticles is reduced by spreading the charge transfer over a larger area. In one or more embodiments, an electronic oxide (or mixed electronic ionic conductor (MIEC)) such as gadolinia-doped ceria (GDC) or gadolinia-doped strontium titanate (GSTA) is incorporated in the anode active layer. It is not required that the electronic oxide (or mixed electronic ionic conductor (MIEC)) be present throughout the thickness of the anode, as charge transfer occurs primarily in the anode active layer. Nickel metal nanoparticles deposited according to one more embodiments are in contact with these electronic oxides. As shown in FIG. 11, this will decrease the electrical potential gradient (or the charge density imbalance) across the nickel nanoparticles interfaces at the electroactive TPBs and increase its stability by lowering the discharge current density.

In one or more embodiments, nanoparticle can be placed in contact with an MIEC by vapor phase infiltration of Ni nanoparticle in anodes that contain the MIEC, in particular that contain MIEC at the AAL, such as for example, composite anode Ni/YSZ/MIEC AAL. The composite anode can be prepared with conventional methods used to prepare mixed metal oxide cermet anodes. An SOFC having vapor deposited nickel particles and a Ni/YSZ/GDC AAL demonstrated increased electrochemical stability during operation. FIG. 12A is a photomicrograph of Ni nanoparticles remaining in a Ni/YSZ/GDC AAL after operation for 24 h at 800° C. under a constant current of 0.75 A/cm². Under identical conditions, Ni nanoparticles did not survive in a Ni/YSZ AAL, that is, an anode lacking an MIEC-containing AAL.

In other embodiments, the nanoparticle can be placed in contact with an MIEC phase using vapor co-infiltration of Ni with an MIEC phase into anodes with Ni/YSZ AAL, the metal and its oxide or other oxide can be deposited at the same time under conditions where both the metal phase and the oxide phases are in equilibrium. The deposition will be governed by the Phase Rule P+F=C+2, wherein P is # of phases in equilibrium, F is the degrees of freedom (# of independent variables), and C is # of components.

In one or more embodiments, the nanoparticle can be placed in contact with an MIEC phase using liquid co-infiltration of Ni with an MIEC phase into anodes with Ni/YSZ AAL. An SOFC having liquid phase co-deposited nickel particles in a Ni/YSZ AAL is shown in FIG. 12B. The figure shows nanoparticles of both phases in close contact.

In one or more embodiments, an ultra-thin layer of a chemically stable oxide with MIEC properties such as ceria, strontium titanates, YSZ and the like is deposited on the infiltrated Ni nanoparticles. Exemplary thicknesses for the electronic oxide layer includes 1 nm-10 nm. An ultra-thin layer of electronic oxide can be deposited by vapor phase deposition under oxidizing conditions. For example, subsequent to nanoparticle deposition at the electroactive TPB sites in the anode, a small amount of hydrogen and flash evaporated $ZrCl_4$ and $YCl_3$ can be passed through the anode and oxidized around the deposited nickel nanoparticles to form an ultra-thin YSZ layer. The process can be conducted at around 1000° C., using a small electric potential bias that will transport the necessary oxygen ions through the electrolyte from the air-side to the anode side as:

Air side: $O_2(g)+4e=2O^{2-}$ (7)

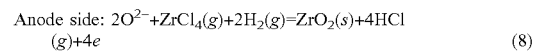

Anode side: $2O^{2-}+ZrCl_4(g)+2H_2(g)=ZrO_2(s)+4HCl(g)+4e$ (8)

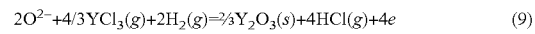

$2O^{2-}+4/3YCl_3(g)+2H_2(g)=2/3Y_2O_3(s)+4HCl(g)+4e$ (9)

The time of the bias voltage can be used as a fine control of the layer thickness. YSZ layer can be used to reduce or prevent physical instability of the nickel nanoparticles.

The following section describes how symmetrical cell measurements can be used to characterize and optimize the infiltrated AAL microstructure. An optimized AAL microstructure can be used in the deposition process described herein to deposit microstructures the provide improved electrochemical performance and microstructure stability.

Figure 13:
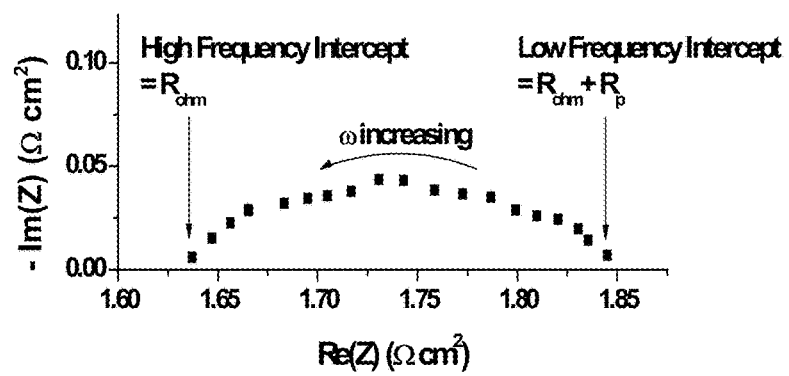
FIG. 13 is a typical Nyquist plot obtained from electro-chemical impedance spectroscopy.

To investigate the catalytic activity of the nickel nanoparticle loading in different anode active layer structures (Ni-GDC, Ni-GSTA, Ni-YSZ-co-infiltrated with GDC, Ni-YSZ-co-infiltrated with GSTA, and Ni-YSZ), anode active layers can be screen printed, e.g., 10 μm thick, on both sides of a metal oxide electrolyte (e.g., 500 μm ScSZ due to better performance at 600° C.). Since the electrodes are only 10 μm thick, liquid phase infiltration can be easily used to vary the Ni nanoparticle loadings in the anode structures. Electrochemical impedance spectroscopy can be performed on the cell under different $H_2/H_2O$ environments (simulating varying fuel utilization) and temperatures. A typical Nyquist plot from such a measurement is shown in FIG. 13, which contains information on the polarization losses of the cell. The difference between the low frequency and high frequency intercepts corresponds to the total polarization resistance ($R_P$) (activation and concentration polarization) of the two similar nickel nanoparticle infiltrated AALS. The polarization resistance of one of the active anode electrodes can be written as:

$$\frac{R_P}{2} = \frac{RT}{2Fi_0} + \frac{RT}{2F} \cdot \frac{1}{i_{as}}\left(1 + \frac{p^0_{H_2}}{p^0_{H_2O}}\right) \quad (10)$$

The first term on the right-hand side of the above equation corresponds to the charge transfer resistance and $i_0$ is the exchange current density that is a measure of the overall effective catalytic activity of the electrodes (infiltrated AAL in this case). The second term corresponds to the mass transfer polarization (resistance) where $i_{as}$ is the anodic saturation current (depends on effective gas diffusivity) and $p_{H_2}^0$ and $p_{H_2O}^0$ are the partial pressures of hydrogen and water vapor in the gas environment, respectively. It should be noted that the anode active layer is only 10 μm thick and so the concentration (mass transfer) polarization is negligible compared to the charge transfer polarization and so it should not influence $R_P$ unless the nickel nanoparticles begin to interfere with the mass transfer process. So $R_P$ is expected to decrease as the nickel nanoparticle loading increases until the optimum loading is reached. From these experiments the optimum active anode layer composition/structure and nickel nanoparticle loading can be identified that will provide the least anodic charge transfer polarization resistance at high fuel utilization in the intermediate temperature range, while not enhancing anodic concentration polarization due to excessive pore blocking.

Figure 14:
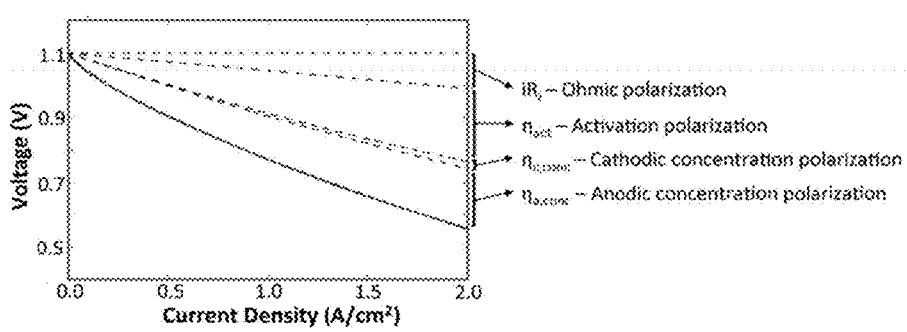
FIG. 14 is an I-V curve with the different cell losses explicitly separated.

Previous work in our group has demonstrated that for a given anodic gas-phase composition, by measuring the I-V characteristics of a cell under different cathodic gas phase compositions, it is possible to identify all the losses in the cell (ohmic polarization, net activation polarization, and anodic and cathodic concentration polarization). FIG. 14 shows results demonstrating the feasibility of this approach. When comparing infiltrated and uninfiltrated cells, the similar nature of the cathode in both cells implies that the cathodic activation polarization will be similar. Thus, any net decrease in the activation polarization due to infiltration can be attributed solely to the Ni nanoparticles, and the effectiveness of the infiltration can be quantified for comparison purposes.

EXPERIMENTAL EXAMPLES

Some experimental examples have demonstrated successful deposition of nickel catalyst nanoparticles from low concentration nickel species in the vapor phase that is generated at a higher temperature through reaction of steam with nickel.

Example 1. Deposition of Nickel Nanoparticles onto a Planar Substrate

Figure 15A:
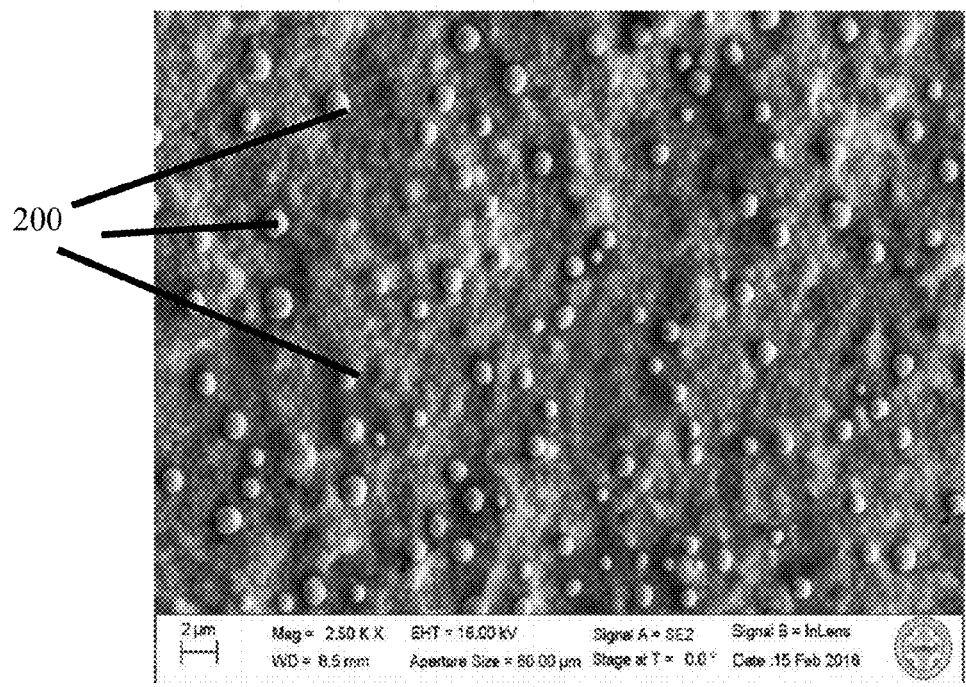
FIG. 15A is a scanning electron photomicrograph of deposited nickel nanoparticles on a zirconia substrate according to one or more embodiments.
Figure 15B:
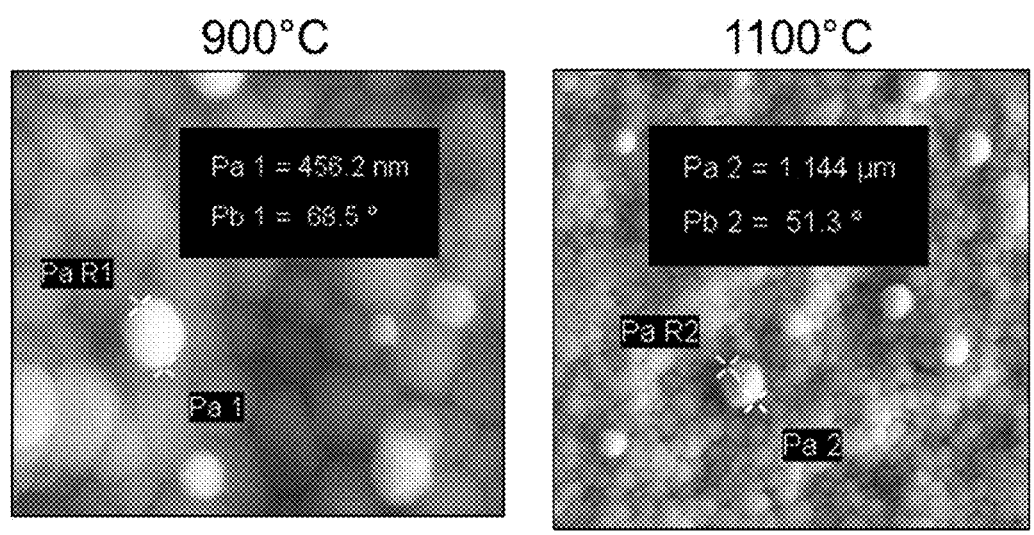
FIG. 15B is a high magnified scanning electron photomicrograph of nickel particles deposited at 900° C. (left) and 1100° C. (right).

In one example, nickel nanoparticles were deposited onto a zirconia surface using a nickel metal source heated to a temperature of 1400° C., while the zirconia substrate was maintained at a temperature of 900° C. A carrier gas of 50% water vapor/50% forming gas was flowed over the nickel source, and the volatilized nickel species deposited as nickel nanoparticles on the zirconia surface. FIG. 15A is a photomicrograph showing nickel nanoparticles 200 at a substrate temperature of 900° C. The deposition temperature can be used to control the particle size of the deposited nanoparticles. By raising the temperature of the substrate, the particle size of the nanoparticles increases. FIG. 15B are highly magnified photomicrographs of particles deposited at 900° C. (left) having a particle diameter of 456 nm and at 1100° C. (right) having a particle size of 1.14 μm.

Example 2. Deposition of Nickel Nanoparticles into a Porous Ni/YSZ Anode

Figure 16A:
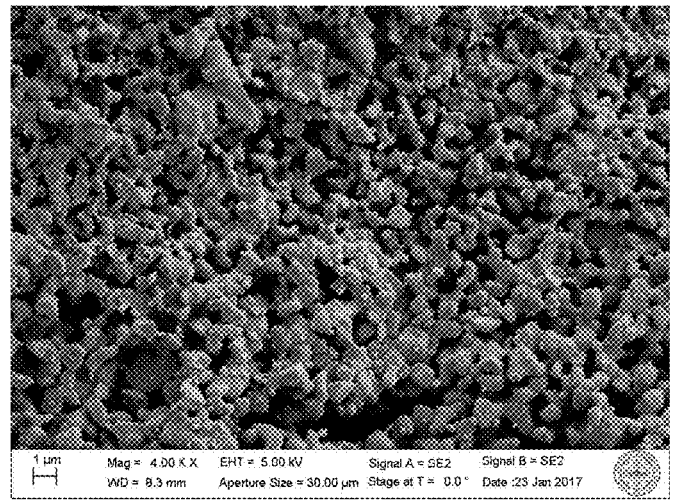
FIGS. 16A-B are scanning electron photomicrographs of nickel nanoparticles deposited on the anode active layer of a Ni-YSZ anode at low magnification (4000×, FIG. 16A) and high magnification (10000×, FIG. 16B).
Figure 16B:
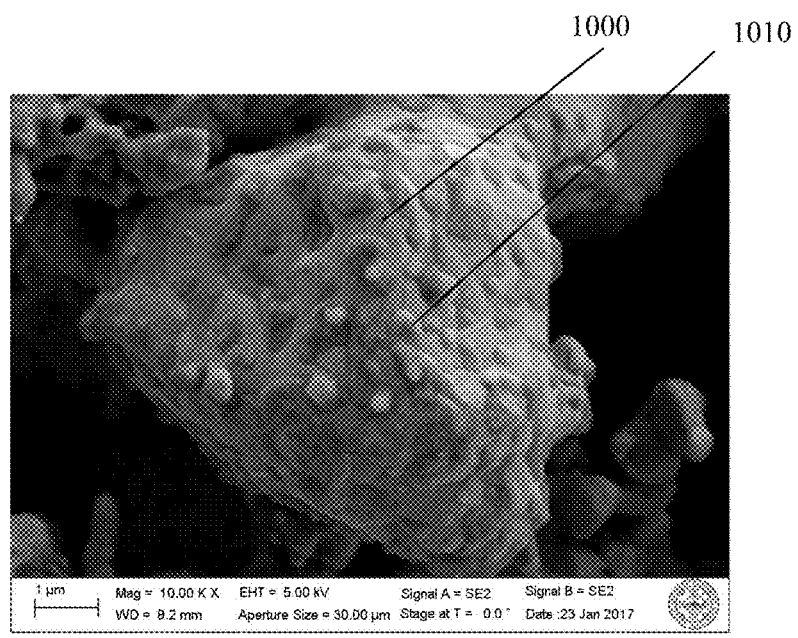

Experimentally, nickel vapor infiltration requires a 'control knob', so that the supersaturation of nickel in the vapor phase can be controlled to deposit nickel at the anode-electrolyte interface. Temperature is the most accessible experimental variable, as a temperature gradient can be established between the nickel vapor source and the cell in a simple fashion. Using a nickel source temperature of 1200° C., and a cell temperature of 1000° C. at 75% pH2O and 0.03 bar pressure, nickel was successfully infiltrated into the anode substrate. FIG. 16 are scanning photomicrographs of the nickel nanoparticles deposited on the active anode layer of the Ni-YSZ anode in low (left) and high (right) resolution. In the high-resolution image, nickel nanoparticles 1000 deposited on a YSZ particle 1010 are clearly visible.

Unless otherwise defined, used or characterized herein, terms that are used herein (including technical and scientific terms) are to be interpreted as having a meaning that is consistent with their accepted meaning in the context of the relevant art and are not to be interpreted in an idealized or overly formal sense unless expressly so defined herein. For example, if a particular composition is referenced, the composition may be substantially, though not perfectly pure, as practical and imperfect realities may apply; e.g., the potential presence of at least trace impurities (e.g., at less than 1 or 2%) can be understood as being within the scope of the description; likewise, if a particular shape is referenced, the shape is intended to include imperfect variations from ideal shapes, e.g., due to manufacturing tolerances. Percentages or concentrations expressed herein can represent either by weight or by volume.

Although the terms, first, second, third, etc., may be used herein to describe various elements, these elements are not to be limited by these terms. These terms are simply used to distinguish one element from another. Thus, a first element, discussed below, could be termed a second element without departing from the teachings of the exemplary embodiments. Spatially relative terms, such as "above," "below," "left," "right," "in front," "behind," and the like, may be used herein for ease of description to describe the relationship of one element to another element, as illustrated in the figures. It will be understood that the spatially relative terms, as well as the illustrated configurations, are intended to encompass different orientations of the apparatus in use or operation in addition to the orientations described herein and depicted in the figures. For example, if the apparatus in the figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90 degrees or at other orientations) and the spatially relative descriptors used herein interpreted accordingly. Further still, in this disclosure, when an element is referred to as being "on," "connected to," "coupled to," "in contact with," etc., another element, it may be directly on, connected to, coupled to, or in contact with the other element or intervening elements may be present unless otherwise specified It will be appreciated that while a particular sequence of steps has been shown and described for purposes of explanation, the sequence may be varied in certain respects, or the steps may be combined, while still obtaining the desired configuration. Additionally, modifications to the disclosed embodiment and the invention as claimed are possible and within the scope of this disclosed invention.

Throughout the description, where articles, devices, and systems are described as having, including, or comprising specific components, or where processes and methods are described as having, including, or comprising specific steps, it is contemplated that, additionally, there are articles, devices, and systems of the present invention that consist essentially of, or consist of, the recited components, and that there are processes and methods according to the present invention that consist essentially of, or consist of, the recited processing steps.

The mention herein of any publication, for example, in the Background section, is not an admission that the publication serves as prior art with respect to any of the claims presented herein. The Background section is presented for purposes of clarity and is not meant as a description of prior art with respect to any claim.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods, and systems for carrying out the several purposes of the disclosed subject matter. It is important, therefore, that the claims be regarded as including such equivalent constructions insofar as they do not depart from the spirit and scope of the disclosed subject matter.

Various modifications to the disclosed embodiments will be apparent to those skilled in the art, and the general principals set forth herein may be applied to other embodiments and applications. Thus, the present invention is not intended to be limited to the embodiments shown or described herein. The terminology used herein is for the purpose of describing particular embodiments and is not intended to be limiting of exemplary embodiments. As used herein, singular forms, such as "a" and "an," are intended to include the plural forms as well, unless the context indicates otherwise.

LEGEND FOR FIG. 7

802 Silver wire leads
804 Alumina exhaust tube
806 Aluminum end cap
808 K-type thermocouple
810 Mica gaskets
812 Ceramic disc
814 Silver mesh
816 Nickel source
818 Alumina tube
820 Alumina rods
822 Alumina fuel and water inlet
824 Aluminum support plate
826 Stainless steel springs
828 Alumina air inlet
830 Alumina tube
832 Anode supported SOFC
834 Nickel mesh
836 Ceramic honeycomb
838 Alumina tube with P wire heater and B-type thermocouple
840 Silicone gaskets
842 Nickel wire leads

The invention claimed is:

1. A method of preparing a metal nanoparticle in or on a surface comprising:
    subjecting a metal to a temperature and a pressure in a carrier gas selected to provide a vapor metal species at a vapor partial pressure in the range of about $10^{-4}$ to about $10^{-11}$ atm, wherein the vapor metal species comprises one or more of vaporized metal, metal oxyhydroxides and metal hydroxides;
    transporting the vapor metal species in the carrier gas to a heated substrate, wherein the heated substrate is at a temperature that is lower than the temperature to which the metal is subjected; and
    depositing the metal as a nanoparticle on the heated substrate.

2. The method of claim 1, wherein the vapor metal species are deposited thermally as a nanoparticle.

3. The method of claim 2, wherein thermally depositing comprises heating the metal at a first higher temperature and maintaining the heated substrate at a second lower temperature, wherein the vapor metal species decompose on contacting the heated substrate to deposit the metal nanoparticles.

4. The method of claim 1, wherein the vapor metal species are deposited electrolytically as a nanoparticle.

5. The method of claim 4, wherein electrolytically depositing comprises applying a voltage at the heated substrate to reduce the vapor metal species to metal.

6. The method of claim 1, wherein the substrate is porous.

7. The method of claim 1, wherein the carrier gas comprises water vapor.

8. The method of claim 1, wherein the substrate is a porous anode of a solid oxide fuel cell.

9. The method of claim 1, wherein the substrate is a solid support of a heterogeneous catalyst.

10. A method of depositing metal nanoparticles in a porous electrode of a solid oxide fuel cell, comprising:
    heating a metal to a first temperature selected to vaporize the metal;
    flowing a carrier gas over the heated metal, wherein the carrier gas interacts with the vaporized metal and forms a metallic species gas phase having a vapor pressure in the range of about $10^{-4}$ to about $10^{-11}$ atm, wherein the metallic species gas phase comprises one or more of vaporized metal, metal oxyhydroxides and metal hydroxides;
    directing the metallic species gas phase towards a surface of a solid oxide fuel cell, wherein the surface comprises a porous electrode of the solid oxide fuel cell, and wherein the solid oxide fuel cell is independently heated to a second temperature that is less than the first temperature; and
    decomposing the metallic species gas phase to deposit nanoparticles of the metal.

11. The method of claim 10, wherein the electrode is an anode.

12. The method of claim 11, wherein the anode further comprises an electronic oxide or mixed electronic ionic conductor (MIEC).

13. The method of claim 11, wherein the deposited metal nanoparticles have a particle density in the range of 10 to 100 per $\mu m^2$, and/or the deposited metal nanoparticles have a particle volume is in the range of 0.1 to 10 $nm^3/nm^2$.

14. The method of claim 10, wherein the nanoparticles deposit at a triple phase boundary of the porous electrode.

15. The method of claim 14, wherein the triple phase boundary is in the range of 5-100 $\mu m/\mu m^3$.

16. The method of claim 11, further comprising:
    prior to deposition, heating the solid oxide fuel cell under reducing conditions, wherein nickel oxide present in the anode is reduced to nickel.

17. The method of claim 16, wherein the nanoparticles deposit within pores of the porous substrate.

18. The method of claim 16, wherein the carrier gas comprises water vapor.

19. The method of claim 16, wherein the metal nanoparticles deposit in an anode active layer (AAL).

* * * * *